United States Patent
Kubin

[19]

[11] Patent Number: 6,044,549
[45] Date of Patent: Apr. 4, 2000

[54] ASSEMBLY OF ELECTRONIC COMPONENTS ONTO SUBSTRATES

[75] Inventor: Richard Kubin, Carleton Place, Canada

[73] Assignee: Nortel Networks Corporation, Montreal, Canada

[21] Appl. No.: 09/164,268

[22] Filed: Oct. 1, 1998

Related U.S. Application Data

[62] Division of application No. 08/762,639, Dec. 9, 1996, Pat. No. 5,912,438.

[51] Int. Cl.[7] ...................................................... H05K 3/34
[52] U.S. Cl. ..................................... 29/840; 29/833; 29/8; 228/56.3
[58] Field of Search ............................. 29/840, 830, 833, 29/825; 228/56.3

[56] References Cited

U.S. PATENT DOCUMENTS

| | | | |
|---|---|---|---|
| 5,457,880 | 10/1995 | McKinley et al. | ..................... 29/840 X |
| 5,593,080 | 1/1997 | Teshima et al. | ....................... 29/840 X |
| 5,743,007 | 4/1998 | Onishi et al. | ............................. 29/840 |

FOREIGN PATENT DOCUMENTS

| | | |
|---|---|---|
| 2-277280 | 11/1990 | Japan . |
| 7-135389 | 5/1995 | Japan . |

*Primary Examiner*—Carl J. Arbes
*Attorney, Agent, or Firm*—Jeffrey M. Measures

[57] ABSTRACT

In a method of assembling an electronic component onto a substrate, a fiducial is defined by a solder mask positioned upon the substrate. A fiducial-defining window in the mask has a base of the window completely provided with a material of different light-reflecting quality than the mask surface. This provides for the peripheral edge of the window, i.e. the mask, to be the edge of the fiducial. Windows in the mask which expose terminal pads upon the substrate and fixed in position relative to edges of the fiducial and both these windows and the fiducial are determined by the mask. Surface mount components are then located upon the substrate relative to the window positions and not relative to the terminal pad positions. This process reduces the number of incorrect connections of terminals of components to terminal pads.

5 Claims, 3 Drawing Sheets

ASSEMBLY OF ELECTRONIC COMPONENTS ONTO SUBSTRATES

The present application is a divisional of U.S. patent application Ser. No. 08/762,639, filed Dec. 9, 1996 now U.S. Pat. No. 5,912,438 and subsequently issued Jun. 15, 1999.

This invention relates to assemblies of electronic components onto substrates.

In the manufacture of printed circuit board structures which include a substrate (i.e. a printed circuit board) and electronic components mounted upon the substrate for automatic assembly of the components onto the substrate, components need to be positioned substantially exactly in their required location to ensure the terminals on the components are aligned correctly with terminal pads on the substrate, and to which they are to be soldered. For this purpose, registration datum positions are provided upon a substrate. These datum positions are located by a sensor of a robot machine which is programmed to move the electronic components to specific coordinate positions based on the datum positions, for positioning the components at their required locations, which coincide with the coordinate positions. The datum positions, or origins or zeros of reference, are referred to in the printed circuit board manufacturing industry as "fiducials". The terminal pads, upon which the terminals of the components are to be placed, are exposed through windows of a solder mask covering the substrate surface. The fiducials are represented by metal pads which are also exposed through windows of the solder mask with clearance being provided between the pads and edges of the windows. Thus, the peripheral edges of the metal pads are identified by the control equipment to set the fiducial position. Fiducial position is in a desired and known location with reference to the terminal pads on the substrate, and with which the terminals of the electronic components need to be aligned. However, slight misalignments are known to occur between the position of the solder mask on the one hand, and the fiducials and terminal pads on the printed circuit board on the other hand. This may not cause a problem with windows of large size, but some windows are only slightly larger than the terminal pads which are exposed within them. This occurs when there is small terminal spacing as for terminal connections of chip or ball grid arrays to substrate terminal pads, and the margin for misalignment error becomes much smaller. In such cases, it is not unknown for edges of windows to interfere and prevent correct terminal placement upon terminal pads, thereby providing defective printed circuit board structures.

The present invention provides a method of assembly of electronic components onto a printed circuit board, and which will reduce the resultant defective structures.

According to the present invention, there is provided a method of assembling an electronic component onto a substrate, comprising providing the substrate having on one surface a plurality of electrical terminals for interconnection with the electronic component;

providing a solder mask upon the substrate, the mask having terminal windows which expose the terminal pads through the terminal windows, the mask also having fiducial means comprising at least one fiducial defining window having the whole base surface area on one side of the peripheral edge of the fiducial defining window, and within the fiducial defining window having a different light reflecting quality from the surface area of the mask on the other side of the peripheral edge of the fiducial defining window;

determining the datum position of the at least one fiducial defining window by reference to the peripheral edge position of the fiducial defining window;

using the determined datum position of the fiducial defining window for guiding the electronic component to a desired location and a desired angle of orientation in accordance with coordinate positions dependent at least in part upon the determined datum position of the fiducial-forming window so as to align the terminals of the component with respective terminal windows; and then soldering the terminals to the terminal pads which are exposed by the terminal windows.

It follows from the method of the invention that the fiducial defining window determines the fiducial datum position. As a result, if the solder mask is slightly misaligned with the substrate, and with the terminal pads still exposed through their respective terminal windows, then the electronic component is guided into position relative to the terminal windows of the terminal pads, and not relative to the terminal pad positions themselves. Hence, the terminals of the electronic component may be slightly misaligned with the terminal pads on the substrate, but are aligned with the terminal windows themselves. It follows that while the terminals of the electronic component and the respective terminal pads may be slightly misaligned, the soldering operation is still successful without interference in the soldering operation by edges of the terminal windows of the terminal pads. Hence, the misalignment of the solder mask with the substrate terminal pad positions does not interfere with placement of the terminals upon the terminal pads of the substrate and soldered joints are not suspect.

In one arrangement, only one fiducial defining window is provided. In this arrangement, the peripheral edge of this window is non-circular and the method comprises determining the datum position and angle of orientation of the fiducial-defining window by reference to the peripheral edge orientation and position of the fiducial-defining window.

However, it is preferred to provide at least two spaced-apart fiducial-defining windows and the datum position of each fiducial-defining window is determined by reference to the peripheral edge position of each of these windows.

It is of the essence of the method of the invention that the light reflecting quality on one side of the peripheral edge of the fiducial-defining window is different than on the other side. This may be achieved by providing a surface of the substrate, and which provides the base surface of the window, with a reflectivity which is different from that of the mask surface. It is preferable, however, to provide upon the substrate surface, two fiducial-forming elements, e.g. of copper, which extend completely across and occupy the whole of individual base surface areas of the fiducial-defining windows. This is achievable by causing the mask to overlap edges of the fiducial-forming elements.

According to a further aspect of the present invention, there is provided an assembly of a substrate with an electronic component mounted upon one surface of the substrate, comprising:

a substrate having electrical terminal pads;

a solder mask extending across the one surface of the substrate, the mask formed with terminal windows with terminal pads exposed through the terminal windows, and also formed with fiducial means comprising at least one fiducial-defining window having the whole base surface area on one side of the peripheral edge of the fiducial-defining window, and within the fiducial-defining window, having a different light reflecting quality from the surface area of the mask on the other side of the peripheral edge of the fiducial-defining window, whereby the peripheral edge of the fiducial-defining window coincides with the peripheral edge of the fiducial; and an electronic component having terminals electrically connected to respective terminal pads of the substrate.

In a practical construction, to ensure that the fiducial-forming elements extend completely across the base area of their respective windows, then the fiducial-defining windows are smaller in area than the fiducial-forming elements and extend across edge regions of the fiducial forming elements so as to obscure these edge regions.

Embodiments of the invention will now be described, by way of example, with reference to the accompanying drawings, in which.

Figure 1:
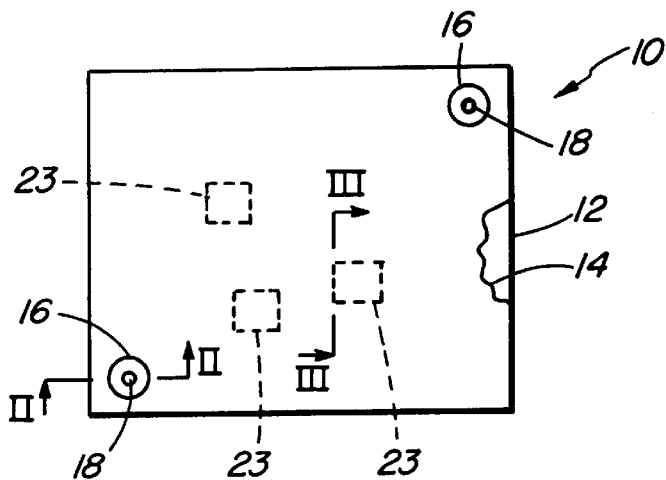
FIG. 1 is a plan view of a prior structure of a circuit board having a solder mask.
Figure 3:
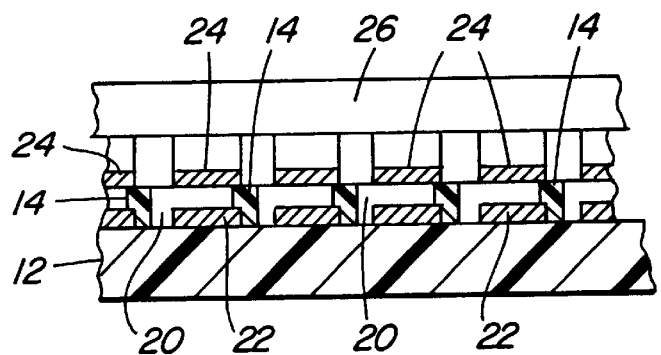
Figure 4:
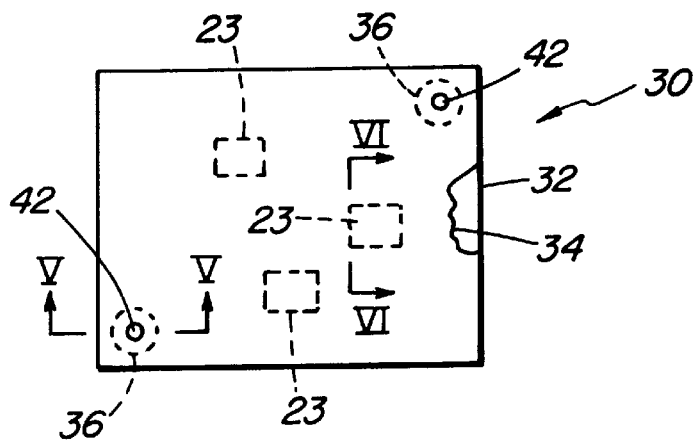
Figure 5:
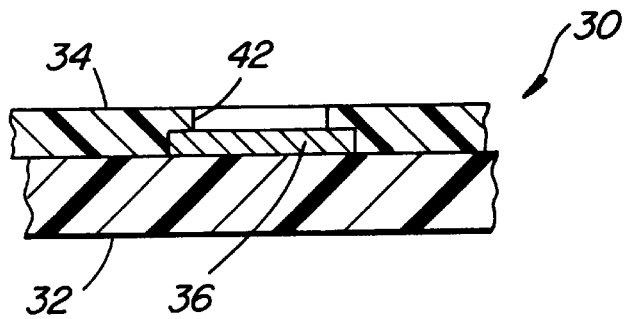
Figure 6:
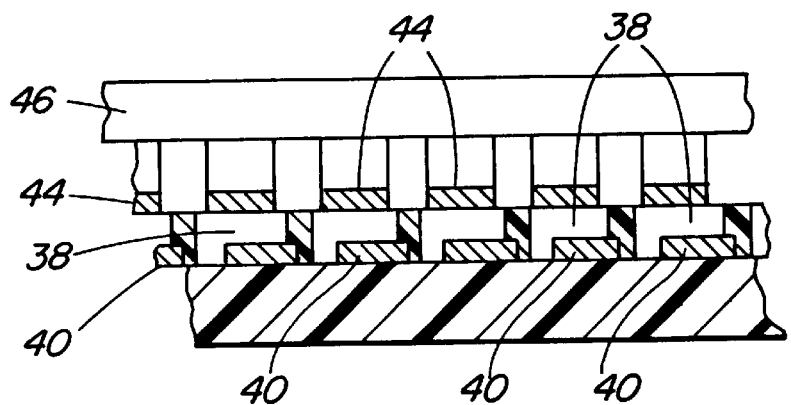
Figure 7:
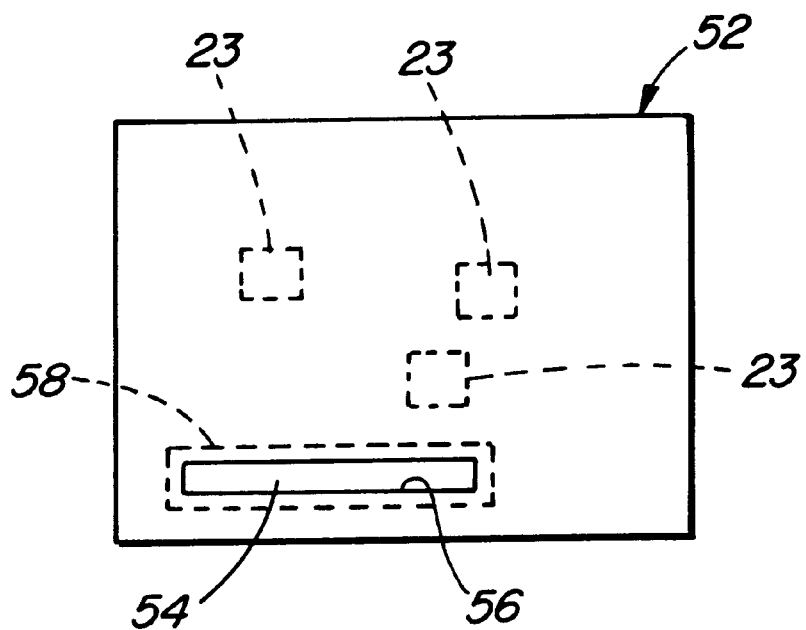

FIG. 3 to a much larger scale than FIG. 1, is a cross-sectional view through part of the board and mask taken along line III—III in FIG. 1;

FIG. 4 is a view similar to FIG. 1 of a printed circuit board having a solder mask according to a first embodiment;

FIGS. 5 and 6 are views taken along lines V—V and VI—VI in FIG. 4 of parts of the structure of the first embodiment and to a larger scale;

FIG. 7 is a plan view of a structure of a second embodiment; and

Figure 8:
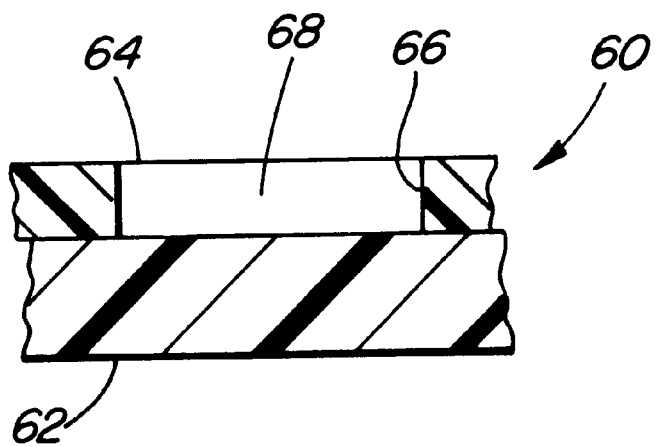

FIG. 8 is a view similar to FIG. 5 of a third embodiment.

As shown by FIG. 1, a prior printed circuit board and solder mask construction 10 for use in a conventional method of assembling electronic components onto the board, comprises a printed circuit board 12 having a solder mask 14 upon it. The solder mask is provided with fiducial clearance windows 16 which expose copper fiducials 18 within the base areas of the windows 16. These fiducials 18 are of smaller area than the windows 16 so that the windows have a clearance around the fiducials as shown particularly by FIG. 1. In addition to this, and as shown in detail by FIG. 3, the mask 14 is provided with terminal pad windows 20 which expose terminal pads 22 on the board surface. These terminal pads are provided for solder connection to terminals of electronic components to be mounted thereon.

Figure 2:
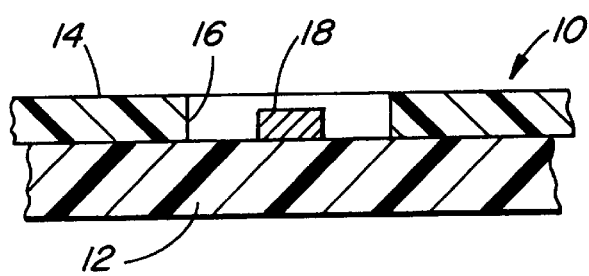
FIG. 2 is to a much larger scale of FIG. 1, and is a cross-sectional view through part of the board and mask taken along line II—II FIG. 1.

As may be seen from FIG. 2, it is not uncommon for the solder mask on a conventional circuit board to be slightly misaligned with the board so that the fiducials 18 are misaligned with the windows 16. FIG. 2 may show an exaggeration of this misalignment, but it is understood that in practical terms the misalignment may be significant as will now be discussed, even though in dimension the misalignment may be small, e.g. 2 mil or greater.

To dispose an electronic component upon the board where its terminals are to be soldered to the terminal pads 22, a vision system (not shown) is used to determine the position of the fiducials 18. This determination is made by sensing the light reflected from the fiducials, which is of higher intensity than the background provided by the board and mask. Each fiducial is conventional in that it is made from copper with an oxide protective surface which provides high intensity of light reflection. The protective surface may be a tin/lead finish, an electroplated nickel with an immersion gold plating or an organic antioxidant. The fiducial positions then provide datum locations used to control a robot equipment for moving the various electronic components to correct coordinate positions and angular positions on the board (e.g. x, y, theta) to register the terminals of the components exactly in line with the terminal pads 22 to enable these to be soldered together. However, in this registration process, no consideration is given to any misalignment of the solder mask which cannot be read by the vision system. As a result, windows for exposing the terminal pads for the respective electronic components must also be misaligned with the terminal pads. In some instances, this is of no due concern as the windows may be made sufficiently large to render the misalignment insignificant. However, with certain constructions, the windows need to be made extremely small, i.e. only slightly larger in area than the terminal pads which they are provided to expose. Such a situation occurs for location of "flip" chips, "solder bumped" chips, or ball grid arrays upon a printed board in which the terminals of the electronic component are exceedingly close together, e.g. of the order of 12 mil. FIG. 1 shows, as an example, three location areas 23 for chips, the chaindotted lines representing the lines of closely positioned terminal pads provided upon the board for chip terminal connection. As a result, and as shown by FIG. 3, the mask at such terminal positions as windows 20 which are misaligned with the terminal pads 22 upon the board 12, and the misalignment may even be so great that the mask overlaps one side of each of the terminal pads. Hence, when the associated terminal 24 of the respective electronic component 26 is disposed in position, it is registered relative to the respective terminal pad 22 and during its location, it is forced to overlap at least partly the solder mask which extends over the terminal pad. As may be seen from this, the solder which is already aligned within the window 20 has much less surface contact with both the terminal pad 22 and the terminal 24 than it would have if the solder mask were correctly aligned with the terminal pad 22. This may lead to a defective solder joint. In addition to this, and as may be seen from FIG. 3, the adjacent window 20 is also misaligned with its terminal pad 22, and this misalignment brings it towards the position at which the next terminal 24 is being registered. Thus, the solder in this window approaches close to the next terminal 24 and, should the misalignment be sufficient, then an undesirable electrical connection could be made.

The invention minimizes the possibility of such a problem as described above from occurring. This is apparent from the embodiment described below.

In a first embodiment, a printed circuit board assembly 30 comprises a printed circuit board 32 having a solder mask 34. The board assembly is similar to the assembly 10, except for in one major respect. As shown by FIG. 4 and in great detail in FIG. 5, board 32 does not have fiducials in the form of the copper pads 18. Instead, the board 32 has fiducial-forming elements 36 which are also copper pads and provided in the same locations as described above for the prior art and having oxide protective surfaces. The solder mask 34 is provided with windows 38 (FIG. 6) for exposing the terminal pads 40 of the board, and it also has fiducial-defining windows 42. Each window 42 is of smaller cross-sectional area than its fiducial-forming element 36 in that the fiducial-forming element extends completely across the base of the fiducial-defining window 42. In fact in the embodiment, each fiducial-forming element 36 extends beneath the mask 34 as the mask overlaps the fiducial-forming element around its edge region thereby obscuring it. In essence therefore, the fiducial-forming elements 36 are not themselves fiducials and the windows 42 are not merely windows to expose such fiducials. In contrast, each fiducial in the embodiment is provided both by the fiducial-forming element 36 and its respective fiducial-defining window 42 in that the area of the fiducial-forming element 36 which is exposed in the base of the window 42 is sensed by the vision system in determining the datum position of the fiducial, and the peripheral edge of the fiducial-defining window 42 provides the peripheral edge of the fiducial. Hence, the fiducial-defining window does in fact determine the position of the fiducial and, thus, its datum location.

As a result of the structure in the first embodiment as described with reference to FIGS. 4 and 5, even if the solder mask 34 is slightly misaligned with the printed circuit board 32, then with the mask overlapping each fiducial-forming element 36, then the peripheral edge of the window 42 still determines the fiducial position. It follows from this therefore, that each electronic component is controlled by the robot equipment to be positioned to its correct x, y, theta registration positions not in relation to the positions of the terminal pads on the board 32, but in relation to the positions of the windows 38 which expose those terminal pads. This is because the windows 38 of the terminal pads are in predetermined positions relative to the fiducial-defining windows 42. As a result, should misalignment between the board and the mask occur then, as shown in FIG. 6, the windows 38 are misaligned with the terminal pads 40 in a manner similar to the misalignment of windows 20 and terminal pads 22 in the conventional structure as described above, and shown particularly in FIG. 3. However, the misalignment in the first embodiment cannot have such disastrous results, as may occur in the conventional method of assembly. As shown by FIG. 6, each of the electronic components 46 is moved in the x, y, and theta directions to its registration position shown by a respective location area 23, and the terminals 44 of each component 46 are automatically aligned with the respective windows 38. As may be seen from FIG. 6, the method of the embodiment and of the invention ensures that the terminals 44 in registering with the windows 38 maintain a respectable and safe distance from an adjacent window 38, which may also contain solder paste or solid solder. It follows that the chances of a terminal being incorrectly soldered to an adjacent terminal pad are insignificant.

As may be seen therefore, the present invention, and as explained in the first embodiment, provides a method of assembly of electronic components onto a printed circuit board which overcomes soldering inaccuracy problems when a solder mask is misaligned with the printed circuit board upon which it lies. Improved assembly yields of boards and electronic components thus result thereby reducing product wastage and resultant economic loss.

In a second embodiment as shown by FIG. 7, the assembly 52, which is otherwise similar to the first embodiment, has only one fiducial 54. This fiducial must be non-circular, and is of such a shape as to enable the vision system to determine the position and angle of orientation of the peripheral edge 56, which is the edge of the fiducial-defining window providing the fiducial. In this case, as with other embodiments, a fiducial-forming member 58 extends completely across the base area of the window and the edges of the mask overlap around the edges of the member 58, as shown in FIG. 7.

In all instances, it is not necessary for a fiducial-forming element to be provided for each fiducial. This may be the case where there is sufficient difference in reflectivity between the surface of the mask and the surface of the substrate within the base area of each fiducial-defining window that the peripheral edge of the window can be determined by a vision system. Such is the case in a third embodiment as shown in FIG. 8 in which, in an assembly 60, the substrate 62 is surmounted by a mask 64. The substrate 62 is formed of a material which is of much lighter color than the mask 64, so that the light reflecting quality on one side of the peripheral edge 66 of the fiducial-defining window 68 is easily detectable by a vision system for determining the datum position of the window.

What is claimed is:

1. A method of assembling an electronic component onto a substrate comprising:

provicing a substrate having on one surface a plurality of electrical terminals for interconnection with the electronic component;

providing a solder mask upon the substrate, the mask having terminal windows which expose the terminal pads through the terminal windows, the mask also having fiducial means comprising at least one fiducial-defining window having the whole base surface area on one side of the peripheral edge of the fiducial-defining window, and within the fiducial-defining window having a different light reflecting quality from the surface of the mask on the other side of the peripheral edge of the fiducial-defining window;

determining the datum position of the at least one fiducial-defining window by reference to the peripheral edge position of the fiducial-defining window;

using the determined datum position of the fiducial-defining window for guiding the electronic component to a desired location, and desired angle of orientation, in accordance with coordinate positions dependent at least in part upon the determined datum position of the fiducial-defining window, so as to align the terminals of the component with the respective terminal windows of the terminals pads; and then soldering the terminals to the terminal pads which are exposed by the terminal windows.

2. A method according to claim 1 wherein only one fiducial-defining window is provided, and the peripheral edge of the fiducial-defining window is non-circular, and the method comprises:

determining the datum position and angle of orientation of the fiducial-defining window by reference to the peripheral edge orientation and position of the fiducial-defining window.

3. A method according to claim 1 wherein at least two fiducial-defining windows are provided, and the method comprises:

determining the datum position of each fiducial-defining window by reference to the peripheral edge position of each fiducial-defining window.

4. A method of assembling an electronic component onto a substrate comprising:

providing a substrate having on one surface a plurality of electrical terminals for interconnection with the electronic component and at least two fiducial-forming elements located in desired positions upon the substrate;

providing a solder mask upon the substrate, the mask having terminal windows which expose the terminal pads through the windows, the mask also having fiducial-defining windows which overlap edges of the fiducial-forming elements, to expose parts of each fiducial element which extends completely across the base area of its respective window, thereby forming a fiducial which is the exposed part of the fiducial-forming element bordered by the peripheral edge of the window;

determining the datum position of each fiducial by determining the peripheral edge position of the fiducial-defining window;

using the determined datum position of the fiducials for guiding the electronic component to a desired location and desired angle of orientation in accordance with coordinate positions dependent upon the determined datum positions so as to align the terminals of the component with the respective terminal windows of the terminal pads; and then soldering the terminals to the terminal pads which are exposed by the terminal windows.

5. A method according to claim 4 comprising forming the solder mask upon the substrate by forming each fiducial-defining window smaller in area than its respective fiducial-forming element so that the solder mask extends over and obscures the edge region of the fiducial-forming element.

\* \* \* \* \*